(12) United States Patent
Mickan et al.

(10) Patent No.: US 7,817,246 B2
(45) Date of Patent: Oct. 19, 2010

(54) OPTICAL APPARATUS

(75) Inventors: Uwe Mickan, Veldhoven (NL); Antonius Johannes Josephus Van Dijsseldonk, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 480 days.

(21) Appl. No.: 11/471,728

(22) Filed: Jun. 21, 2006

(65) Prior Publication Data
US 2007/0296943 A1    Dec. 27, 2007

(51) Int. Cl.
*G03B 27/52* (2006.01)
(52) U.S. Cl. .............................. 355/55; 355/67; 359/859
(58) Field of Classification Search .................. 355/53, 355/67, 55; 359/859
See application file for complete search history.

(56) References Cited

U.S. PATENT DOCUMENTS

| | | | | |
|---|---|---|---|---|
| 4,812,030 A | * | 3/1989 | Pinson ........................ 359/859 |
| 4,861,148 A | * | 8/1989 | Sato et al. .................... 359/366 |
| 4,863,253 A | * | 9/1989 | Shafer et al. ................. 359/859 |
| 5,136,413 A | * | 8/1992 | MacDonald et al. ..... 359/213.1 |
| 5,212,588 A | * | 5/1993 | Viswanathan et al. ....... 359/355 |
| 5,510,230 A | * | 4/1996 | Tennant et al. .............. 430/325 |
| 5,737,137 A | * | 4/1998 | Cohen et al. ................. 359/859 |
| 5,989,776 A | * | 11/1999 | Felter et al. ............... 430/270.1 |
| 6,225,027 B1 | * | 5/2001 | Replogle et al. ............. 430/311 |
| 6,331,710 B1 | | 12/2001 | Wang et al. ............... 250/492.2 |
| 6,452,661 B1 | | 9/2002 | Komatsuda ................... 355/67 |
| 6,859,259 B2 | * | 2/2005 | Bakker et al. .................. 355/53 |
| 2002/0113954 A1 | | 8/2002 | Antoni et al. .................. 355/53 |
| 2003/0227603 A1 | * | 12/2003 | Dierichs ....................... 355/47 |
| 2004/0257546 A1 | * | 12/2004 | Banine ........................ 355/53 |
| 2006/0002113 A1 | | 1/2006 | Chandhok et al. ............ 362/257 |
| 2006/0175557 A1 | * | 8/2006 | Ferber et al. ............. 250/492.1 |

FOREIGN PATENT DOCUMENTS

| | | |
|---|---|---|
| WO | WO 2005/031748 A1 | 4/2005 |
| WO | WO 2006/021419 A2 | 3/2006 |
| WO | WO 2006/086486 A2 | 8/2006 |

OTHER PUBLICATIONS

International Search Report issued for PCT Application No. PCT/EP2007/005144, dated Oct. 31, 2007.

* cited by examiner

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP

(57) ABSTRACT

An optical apparatus is disclosed that has a convex mirror and a concave mirror with an aperture, wherein, in use, radiation from a radiation emitter passes through the aperture and is incident upon the convex mirror before being incident upon the concave mirror, the optical apparatus arranged to form the radiation into a radiation beam, wherein the concave mirror is translatable towards and away from the convex mirror or the convex mirror is translatable towards and away from the concave mirror, to adjust divergence of the radiation beam.

19 Claims, 3 Drawing Sheets

US 7,817,246 B2

OPTICAL APPARATUS

FIELD

The present invention relates to an optical apparatus which may form part of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In conventional optical lithography, the pattern may be transferred from the patterning device to the substrate using a projection system comprising a series of lenses. The lenses may be transmissive or reflective, the choice between transmissive or reflective lenses generally being based upon properties of the wavelength of radiation beam used. The pattern projected onto the substrate may suffer uniformity degradation due to flare caused by lenses of the projection system.

Further, the resolution achievable using a given lithographic apparatus is dependent upon the wavelength of radiation that the lithographic apparatus uses. In recent years lithographic apparatus manufacturers have been working on developing lithographic apparatus which use wavelengths which are significantly shorter than the wavelengths currently used. These wavelengths are commonly referred to as extreme ultra-violet (EUV), and a relevant wavelength is typically at or around 13.5 nanometers. EUV radiation is absorbed by most materials, and this means that it is desired not to use transmissive lenses in EUV lithographic apparatus. For this reason, the projection system of an EUV lithographic apparatus is usually formed from a series of mirrors.

Users of lithographic apparatus are becoming increasingly interested in being able to control parameters of the radiation beam which is transferred by the projection system. One such property relates to the divergence of the radiation beam, and is commonly referred to as sigma ($\sigma$).

SUMMARY

It is desirable, for example, to provide a lithographic apparatus which provides at least some control over sigma in a novel and inventive manner.

According to an aspect of the invention, there is provided an optical apparatus, comprising a convex mirror; and a concave mirror with an aperture, wherein, in use, radiation from a radiation emitter passes through the aperture and is incident upon the convex mirror before being incident upon the concave mirror, the optical apparatus arranged to form the radiation into a radiation beam, wherein the concave mirror is translatable towards and away from the convex mirror or the convex mirror is translatable towards and away from the concave mirror, to adjust divergence of the radiation beam.

According to an aspect of the invention, there is provided a method of adjusting divergence of a radiation beam to be used in lithography, the method using a convex mirror adjacent to a concave mirror, the mirrors being arranged such that radiation passes through an aperture in the concave mirror and is incident upon the convex mirror before being incident upon the concave mirror, thereby forming the radiation into a radiation beam, the method comprising translating the concave mirror towards or away from the convex mirror, or translating the convex mirror towards or away from the concave mirror, thereby adjusting divergence of the radiation beam.

According to an aspect of the invention, there is provided an optical apparatus, comprising a conical first mirror with a reflective outer surface; and a conical second mirror with a reflective inner surface and an aperture, wherein, in use, radiation from a radiation emitter passes through the aperture and is incident upon the first conical mirror before being incident upon the second conical mirror, the optical apparatus arranged to form the radiation into a radiation beam, wherein the first conical mirror is translatable towards and away from the second conical mirror or the second conical mirror is translatable towards and away from the first conical mirror, to adjust divergence of the radiation beam.

According to an aspect of the invention, there is provided an optical apparatus, comprising a conical first mirror with a reflective outer surface; and a conical second mirror with a reflective inner surface and an aperture, wherein, in use, radiation from a radiation emitter passes through the aperture and is incident upon the first conical mirror before being incident upon the second conical mirror, the optical apparatus arranged to form the radiation into a radiation beam, wherein either or both of the first conical mirror and the second conical mirror comprise a set of tiltable flat mirror areas, arranged such that tilting the flat mirror areas provides adjustment of divergence of the radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
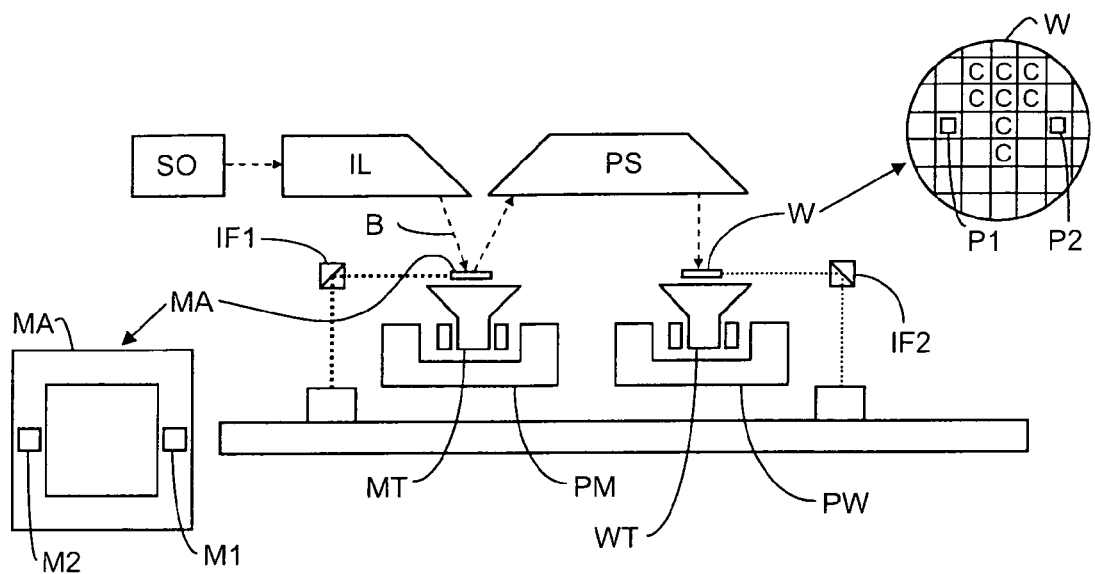
FIG. 1 depicts a lithographic apparatus which may incorporate an embodiment of the invention.

FIG. 1 schematically depicts a lithographic apparatus which may incorporate one embodiment of the invention. The apparatus comprises:

an illumination system (illumination system) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). In some instances one or more optical elements of the apparatus may be of a transmissive type.

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illumination system EL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system comprising, for example, suitable directing mirrors and/or a beam expander. In other cases the source may be an integral part of the lithographic apparatus, for example when the source is a mercury lamp. The source SO and the illumination system IL, together with the beam delivery system if required, may be referred to as a radiation system.

The illumination system IL usually provides some beam conditioning, and may be used to give the radiation beam a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus shown in FIG. 1 may use for example extreme ultra-violet radiation (having a wavelength or wavelengths at or around 13.5 nanometers).

Typical reflective lithographic apparatus comprise a collector which is arranged to collect radiation generated by a radiation emitter of the source SO, and form the radiation into a beam which is directed at the illumination system IL. Such reflective lithographic apparatus generally use a Wolter collector, which comprises a nested series of curved mirrors which are located adjacent to the radiation emitter. The radiation emitter may, for example, comprise a Xenon plasma. In an embodiment of the invention instead of providing a Wolter collector to collect radiation generated by the radiation emitter, a collector of the type shown in FIG. 2 is provided.

Figure 2:
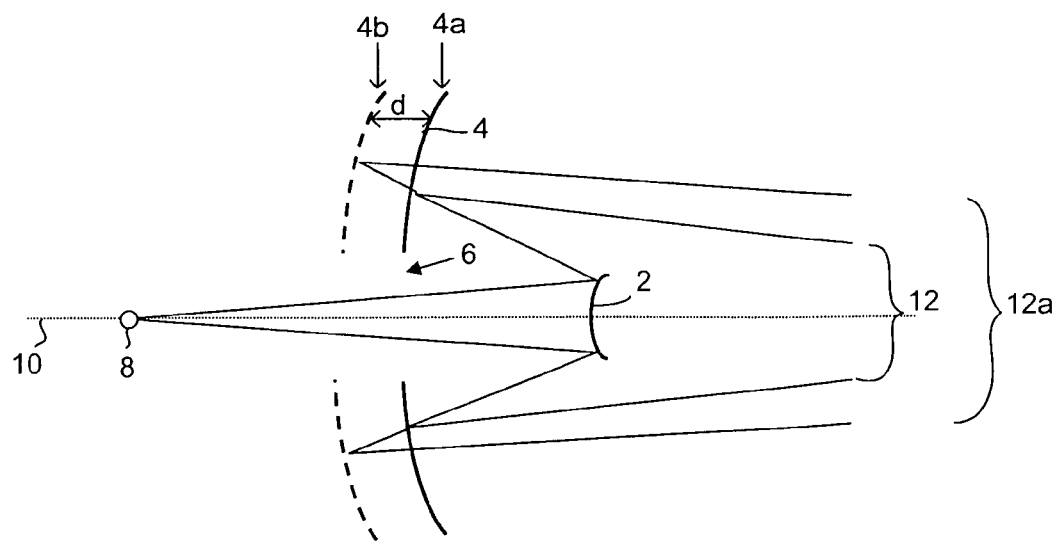
FIG. 2 depicts an optical apparatus according to an embodiment of the invention.

Referring to FIG. 2, the collector comprises a first mirror 2 and a second mirror 4. An aperture 6 is provided in substantially the center of the second mirror 4. A radiation emitter 8 is located adjacent to the collector. The first and second mirrors 2, 4 and radiation emitter 8 all lie on a common optical axis 10. An aperture (not shown) maybe located between the radiation emitter 8 and the first mirror 4.

The first and second mirrors 2, 4 are arranged to collect radiation from the radiation emitter 8 and focus it into a radiation beam 12 which is passed on to the illumination system IL (not shown in FIG. 2). The first and second mirrors 2, 4 may be arranged to focus the radiation through an intermediate focus point, although this is not essential. The first mirror 2 is convex and the second mirror 4 is concave. The curvatures of the mirrors may be selected such that the radiation is focused through the intermediate focus point. The curvatures may be selected by using a ray-tracing program to determine which combinations of curvature will direct the radiation through the intermediate focus point. The ray tracing program may be set to direct the radiation precisely through the intermediate focus point, or may be set to direct the radiation through a region with a finite width (e.g., diameter) which surrounds the intermediate focus point.

The second mirror 4 is movable between a first position 4a and a second position 4b (the movement being along the optical axis 10). A motor (not illustrated) may be used to move the mirror. The distance over which the second mirror may travel is indicated as d in FIG. 2. Moving the second mirror 4 from the first position 4a to the second position 4b changes the divergence of the radiation beam formed by the collector. This corresponds to a change of sigma (σ) of the radiation beam. The change of divergence is represented schematically in FIG. 2 by representing a modified radiation beam 12a using broken lines. It will be appreciated that the mirror may also be moved to positions which are between the first and second positions 4a, 4b.

Figure 3:
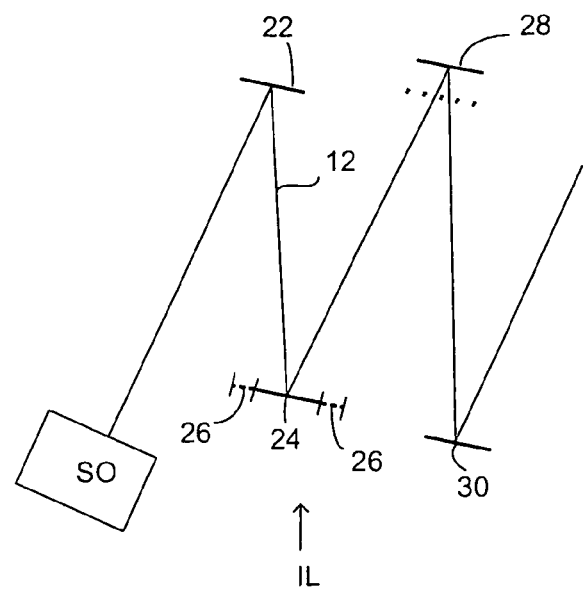
FIG. 3 depicts an optical source and illumination system according to an embodiment of the invention.

FIG. 3 shows schematically the illumination system IL and the source SO (which comprises a radiation emitter and a collector). The illumination system IL comprises four mirrors. A first mirror 22 of the illumination system IL is a facet mirror which comprises a multiplicity of elements and is arranged such that the radiation beam 12 forms a field of a desired shape on the patterning device MA (see FIG. 1). A second mirror of the illumination system 24 is provided with blades 26 which may be used to increase or reduce the size of the reflective portion of the second mirror. A third mirror 28 of the illumination system IL may be movable along its optical axis (the movement is shown schematically by a dotted line in FIG. 3). The third mirror 28 may together with a fourth mirror 30 form a telescope, which may be used to modify the radiation beam 12 before it passes to the patterning device MA and projection system PS (see FIG. 1). Although the mirrors 22, 24, 28, 30 are shown as being planar, this is for ease of illustration only; some or all of the mirrors may be curved.

By adjusting the position of the second mirror 4 of the collector, as shown in FIG. 2, the cross-sectional size of the radiation beam 12 when it is incident upon the second mirror of the illumination system (FIG. 3) may be adjusted. This allows the sigma of the radiation beam 12 to be adjusted without having to use the blades 26 to cut out a portion of the beam's cross-section and thereby reduce the amount of power in the beam (keeping the power of the beam as high as possible is a significant aspect of reflective lithographic apparatus). When the collector according to the embodiment of the invention is used some radiation may be lost, but this may be significantly less than would be lost if blades 26 were used to reduce the cross-sectional width (e.g., diameter) of the beam of radiation. The amount of lost radiation will depend upon the size of the radiation emitter 8.

When used in combination with a conventional projection system, the embodiment of the invention as shown in FIGS. 2 and 3 allows the numerical aperture and the sigma of the radiation beam received by the substrate W to be separately adjusted.

The first mirror 2 shown in FIG. 2 may be moveable along the optical axis 10. The first mirror 2 may be moved instead of the second mirror 4; this will change the divergence of the radiation beam formed by the collector (in a manner similar to moving the second mirror 4). The first and second mirrors 2, 4 may both be moveable. Moving the first and second mirrors 2, 4 may allow additional properties of the radiation beam to be controlled.

Figure 4:
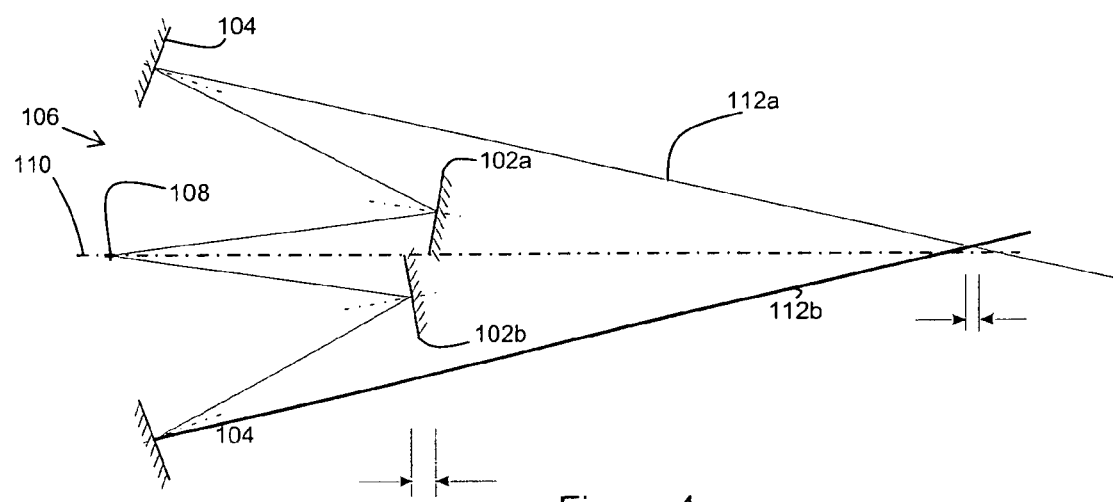
FIG. 4 depicts an alternative arrangement of the embodiment of the invention.

Although the embodiment of the invention is described in terms of curved mirrors, the invention may be implemented using mirrors having other forms. For example, two conical mirrors may be used. An example of this is shown in FIG. 4. In FIG. 4 the collector comprises a conical first mirror 102a,b which is reflective upon its outer surface and a conical second mirror 104 which is reflective on its inner surface. The conical second mirror 104 includes an aperture 106 through which radiation from a source 108 may pass. An upper half of FIG. 4 (i.e. elements which are above an optical axis 110) shows the conical first mirror 102a in a first position, thereby forming a radiation beam 112a with a particular divergence. In the lower half of FIG. 4, the first conical mirror 102b has been translated along the optical axis towards the second conical mirror 104. This has the effect of changing the divergence of the radiation beam 112b. Movement of the first conical mirror 102a,b and consequent movement of a focal point of the radiation beam 112a,b is indicated by arrows.

The conical second mirror 104 may be moveable along the optical axis 110. The conical second mirror 104 may be moved instead of the conical first mirror 102a,b, or may be moved in addition to moving the first conical mirror. Moving the conical first and second mirrors 102a,b, 104 in unison (i.e. through the same distance in the same direction) will translate the intermediate focus along the optical axis, without modifying the divergence of the radiation beam.

Figure 5:
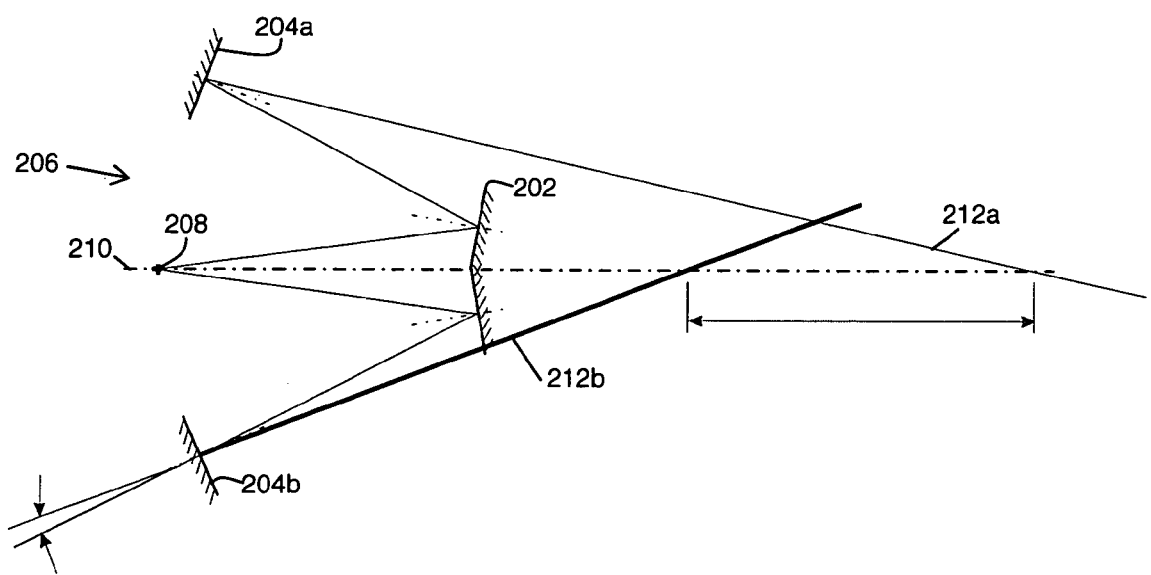
FIG. 5 depicts a further embodiment of the invention.

A further embodiment of the invention is illustrated in FIG. 5. The collector comprises a conical first mirror 202 and a second mirror 204a,b which comprises a set of flat mirror areas which are arranged to form a conical mirror. The second conical mirror 204a,b is provided with an aperture 206 which allows radiation from a radiation source 208 to pass to the first conical mirror 202. An upper half of FIG. 5 (i.e. elements which lie above an optical axis 210) shows the second conical mirror 204a in a first configuration which forms a radiation beam 212a having a particular divergence. In the lower half of FIG. 5 the flat mirror areas which comprise the second conical mirror 204b have been tilted (only one flat mirror area is shown), thereby providing a radiation beam 212b with a different divergence. Tilting of the flat mirror areas 204b may be achieved for example using one or more suitable actuators.

The first conical mirror 202 may comprise a suitably arranged set of flat mirror areas. These flat mirror areas may be tilted (e.g. using one or more actuators) instead of tilting the flat mirror areas of the second conical mirror 204a,b. Alternatively, the flat mirror areas of the first and second conical mirrors 202, 204a,b may both be tilted. In some instances the first and/or second conical mirrors 202, 204a,b may be both tiltable and translatable along the optical axis.

In a further arrangement, the mirror areas include some curvature instead of being flat. The curvature may, for example, extend laterally around the first and/or second conical mirrors 202, 204a,b. Alternatively or additionally, the curvature may, for example, extend along the first and/or second mirrors 202, 204a,b.

The illuminator IL described above in relation to FIG. 3 may be used with the embodiments of the invention described in relation to FIGS. 4 and 5.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although the use of EUV radiation has been mentioned in the above description of the embodiment of the invention, it will be appreciated that other wavelengths of radiation may be used. The terms "radiation" and "beam" used herein thus encompass all types of electromagnetic radiation, including ultraviolet (UV) radiation (e.g. having a wavelength of or about 365, 355, 248, 193, 157 or 126 nm) and extreme ultraviolet (EUV) radiation (e.g. having a wavelength in the range of 5-20 nm), as well as particle beams, such as ion beams or electron beams where appropriate.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. An optical apparatus for use with a lithographic apparatus, the optical apparatus comprising:
 a convex mirror; and
 a concave mirror with an aperture,
 wherein, in use, divergent radiation from a radiation emitter passes through the aperture and is incident upon the convex mirror before being incident upon the concave mirror, the optical apparatus arranged to form the radiation into a radiation beam, wherein the concave mirror is translatable towards and away from the convex mirror or the convex mirror is translatable towards and away from the concave mirror, to adjust divergence of the radiation beam, wherein the convex mirror and the concave mirror are constructed and arranged to focus the radiation beam to a focal point in the lithographic apparatus.

2. The apparatus of claim 1, wherein both the concave mirror and the convex mirror are translatable towards and away from each other.

3. The apparatus of claim 1, further comprising one or more motors arranged to translate the translatable mirror.

4. The apparatus of claim 1, further comprising a radiation emitter located adjacent to the concave mirror and configured to emit the radiation.

5. A lithographic apparatus, comprising:
 an optical apparatus, comprising a convex mirror and a concave mirror with an aperture, wherein, in use, divergent radiation passes through the aperture and is incident upon the convex mirror before being incident upon the concave mirror, the optical apparatus arranged to form the radiation into a radiation beam, wherein the concave mirror is translatable towards and away from the convex mirror or the convex mirror is translatable towards and away from the concave mirror, to adjust divergence of the radiation beam, wherein the convex mirror and the concave mirror are constructed and arranged to focus the radiation beam to a focal point;

an illumination system configured to condition the radiation beam formed by the optical apparatus;

a support constructed to support a patterning device, the patterning device being capable of imparting the radiation beam with a pattern in its cross-section to form a patterned radiation beam; and a projection system configured to project the patterned radiation beam onto a target portion of a substrate.

6. The apparatus of claim 5, wherein the illumination system comprises a plurality of mirrors arranged to condition the radiation beam, at least one of the mirrors being provided with blades arranged to allow the size of the reflective portion of the mirror to be adjusted.

7. The apparatus of claim 5, wherein the illumination system comprises a plurality of mirrors arranged to condition the radiation beam, at least one of the plurality of mirrors being translatable along its optical axis.

8. The apparatus of claim 7, wherein one of the other mirrors of the illumination system forms a telescope together with the translatable mirror of the illumination system.

9. A method of adjusting divergence of a radiation beam to be used in a lithographic apparatus, the method comprising:

forming a radiation beam from divergent radiation using a convex mirror adjacent to a concave mirror, the mirrors being arranged such that the radiation passes through an aperture in the concave mirror and is incident upon the convex mirror before being incident upon the concave mirror;

translating the concave mirror towards or away from the convex mirror, or translating the convex mirror towards or away from the concave mirror, thereby adjusting divergence of the radiation beam; and focusing the radiation beam to a focal point in the lithographic apparatus.

10. The method of claim 9, further comprising translating a mirror of an illumination system which receives the radiation beam reflected from the concave mirror.

11. An optical apparatus, comprising:

a conical first mirror with a reflective outer surface; and a conical second mirror with a reflective inner surface and an aperture, wherein, in use, divergent radiation from a radiation emitter passes through the aperture and is incident upon the first conical mirror before being incident upon the second conical mirror, the optical apparatus arranged to form the radiation into a radiation beam, wherein the first conical mirror is translatable towards and away from the second conical mirror or the second conical mirror is translatable towards and away from the first conical mirror, to adjust divergence of the radiation beam, wherein the conical first mirror and the conical second mirror are constructed and arranged to focus the radiation beam to a focal point.

12. The apparatus of claim 11, wherein both the second conical mirror and the first conical mirror are translatable towards and away from each other.

13. The apparatus of claim 11, further comprising one or more motors arranged to translate the translatable mirror.

14. A lithographic apparatus, comprising:

an optical apparatus, comprising a conical first mirror with a reflective outer surface; and a conical second mirror with a reflective inner surface and an aperture, wherein, in use, divergent radiation passes through the aperture and is incident upon the first conical mirror before being incident upon the second conical mirror, the optical apparatus arranged to form the radiation into a radiation beam, wherein the first conical mirror is translatable towards and away from the second conical mirror or the second conical mirror is translatable towards and away from the first conical mirror, to adjust divergence of the radiation beam, wherein the conical first mirror and the conical second mirror are constructed and arranged to focus the radiation beam to a focal point;

an illumination system configured to condition the radiation beam formed by the optical apparatus;

a support constructed to support a patterning device, the patterning device being capable of imparting the radiation beam with a pattern in its cross-section to form a patterned radiation beam; and a projection system configured to project the patterned radiation beam onto a target portion of a substrate.

15. The apparatus of claim 14, wherein the illumination system comprises a plurality of mirrors arranged to condition the radiation beam, at least one of the mirrors provided with blades arranged to allow the size of a reflective portion of the mirror to be adjusted.

16. The apparatus of claim 14, wherein the illumination system comprises a plurality of mirrors arranged to condition the radiation beam, at least one of the plurality of mirrors being translatable along its optical axis.

17. The apparatus of claim 16, wherein one of the other mirrors of the illumination system forms a telescope together with the translatable mirror of the illumination system.

18. An optical apparatus, comprising:

a conical first mirror with a reflective outer surface; and a conical second mirror with a reflective inner surface and an aperture, wherein, in use, radiation from a radiation emitter passes through the aperture and is incident upon the first conical mirror before being incident upon the second conical mirror, the optical apparatus arranged to form the radiation into a radiation beam, wherein either or both of the first conical mirror and the second conical mirror comprise a set of tiltable flat mirror areas, arranged such that tilting the flat mirror areas provides adjustment of divergence of the radiation beam.

19. The optical apparatus of claim 18, wherein the first conical mirror, the second conical mirror, or both, is translatable towards and away from the other conical mirror.

* * * * *